(12) United States Patent
Wang

(10) Patent No.: US 9,588,414 B2
(45) Date of Patent: Mar. 7, 2017

(54) PHOTOMASK PATTERN AND METHOD FOR FORMING THE SAME

(71) Applicant: Semiconductor Manufacturing International (Shanghai) Corporation, Shanghai (CN)

(72) Inventor: Tiezhu Wang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 36 days.

(21) Appl. No.: 14/332,565

(22) Filed: Jul. 16, 2014

(65) Prior Publication Data

US 2015/0185600 A1 Jul. 2, 2015

(30) Foreign Application Priority Data

Dec. 30, 2013 (CN) .......................... 2013 1 0745658

(51) Int. Cl.
*G03F 1/38* (2012.01)

(52) U.S. Cl.
CPC ...................................... *G03F 1/38* (2013.01)

(58) Field of Classification Search
None
See application file for complete search history.

(56) References Cited

U.S. PATENT DOCUMENTS 5,523,186 A * 6/1996 Lin ..................... G03F 7/70283
430/311

* cited by examiner

*Primary Examiner* — Kathleen Duda
(74) *Attorney, Agent, or Firm* — Anova Law Group, PLLC

(57) ABSTRACT

Various embodiments provide photomask patterns and methods for forming the same. In an exemplary method, a to-be-etched pattern can be provided. The to-be-etched pattern can be divided into a first mask pattern and an initial second mask pattern. The first mask pattern can include one or more first patterns and the initial second mask pattern can include one or more second patterns. A second print scattering pattern can be formed and added to the initial second mask pattern. A position of the second print scattering pattern can be separated from a position of the one or more first patterns of the first mask pattern.

18 Claims, 12 Drawing Sheets

PHOTOMASK PATTERN AND METHOD FOR FORMING THE SAME

CROSS-REFERENCES TO RELATED APPLICATIONS

This application claims priority to Chinese Patent Application No. CN201310745658.0, filed on Dec. 30, 2013, the entire contents of which are incorporated herein by reference.

FIELD OF THE DISCLOSURE

The present disclosure relates to the field of semiconductor technology and, more particularly, relates to photomask patterns and methods for forming the same.

BACKGROUND

With continuous shrinking of semiconductor process node dimensions, conventional lithography process, i.e., a patterning process that uses one photomask, has encountered limitation. That is, because the pitch between adjacent patterns is often too small, adhering between adjacent patterns can occur due to an optical proximity effect.

As the critical dimensions of semiconductor devices become smaller and smaller, a double patterning method has been used to solve the problem described above. With the double patterning method, a pattern to be formed is divided into two kinds of patterns, a first mask pattern and a second mask pattern. Next, a first pattern is formed using a first patterning process, and a second pattern is formed using a second patterning process. Thus, using such a double patterning method, the optical proximity effect caused by overly small pitch between adjacent patterns can be avoided.

Conventionally, a polysilicon layer can be patterned using a double patterning process, and then be etched to form a polysilicon gate, so as to improve accuracy and uniformity of the size of the polysilicon gate. A first mask pattern can be used in a first patterning process on the polysilicon layer to form a strip-shaped gate pattern. Further, a second mask pattern can be used in a second patterning process on the polysilicon layer to cut the strip-shaped gate pattern to form the polysilicon gates.

Typically, the second mask pattern has a relatively low pattern density and an uneven pattern distribution, which can cause a relatively significant lithography loading effect and a relatively small process window, and can eventually result in inaccurate size of exposed patterns during the second patterning process using the second mask pattern. Thus, during a subsequent etching process, the size of the polysilicon gates formed after cutting the gate pattern can have a relatively large deviation. The size of the formed polysilicon gates can thus be inaccurate. The disclosed methods and structures are directed to solve one or more problems set forth above and other problems.

BRIEF SUMMARY OF THE DISCLOSURE

One aspect of the present disclosure includes methods for forming a photomask pattern. In an exemplary method, a to-be-etched pattern can be provided. The to-be-etched pattern can be divided into a first mask pattern and an initial second mask pattern. The first mask pattern can include one or more first patterns and the initial second mask pattern can include one or more second patterns. A second print scattering pattern can be formed and added to the initial second mask pattern. A position of the second print scattering pattern can be separated from a position of the one or more first patterns of the first mask pattern.

Another aspect of the present disclosure includes photomask patterns. An exemplary photomask pattern can include a first mask pattern and a second mask pattern. The first mask pattern can include one or more first patterns. The second mask pattern can include an initial second mask pattern. The initial second mask pattern can include one or more second patterns. The one or more first patterns and the one or more second patterns can form a to-be-etched pattern. The second mask pattern can further include a second print scattering pattern. A position of the second print scattering pattern can be separated from a position of the one or more first patterns.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

During a double patterning process, photomask pattern of a second mask layer (i.e., a second mask pattern) has a relatively low pattern density and an uneven distribution of pattern density, which can cause the size of exposed patterns to have poor accuracy during a second patterning process. The pattern density of the second mask pattern can be adjusted by adding a non-print scattering pattern to the second mask pattern. The non-print scattering pattern can be formed such that damage to a pattern previously formed during a first patterning process can be prevented. Further, the size of the non-print scattering pattern can be relatively small and can be lower than the resolution of the photolithography process. Therefore, the non-print scattering pattern is not exposed or developed in the photoresist layer. That is, the non-print scattering pattern is not printed in the photoresist layer, and thus does not affect the pattern previously formed during the first patterning process. However, because the non-print scattering pattern has a relatively small size, the effect of improving pattern density and increasing process window using the non-print scattering pattern may be limited.

As used herein, a non-print scattering pattern can refer to a scattering pattern on a photomask that is not, or is not intended to be, transferred to a photoresist layer during an exposure process. That is, 'non-print' refers to 'not to be printed', or 'not to be transferred'.

As used herein, a print scattering pattern can refer to a scattering pattern on a photomask that is, or is intended to be, transferred to a photoresist layer during an exposure process. That is, 'print' refers to 'to be printed', or 'to be transferred'.

In various disclosed embodiments, a certain rule can be established for photomask design, and a print scattering pattern can be added to a second mask pattern according to the rule. In addition, the print scattering pattern can be formed such that, during a subsequent patterning process, the print scattering pattern does not damage a pattern previously formed during a first patterning process. Thus, process window of a second patterning process can be further improved. Pattern density of the second mask pattern can be adjusted. Accuracy of the size of exposed patterns during the second patterning process can thus be improved.

Figure 16:
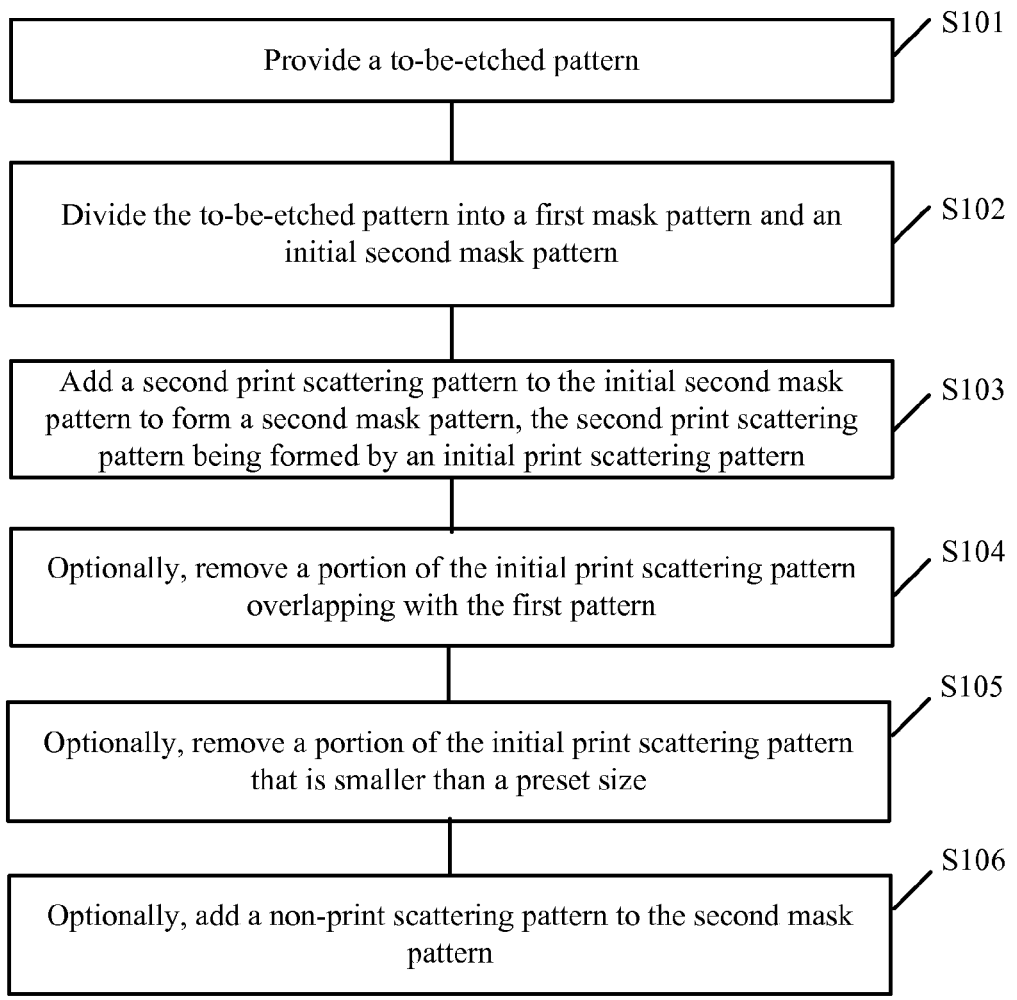
FIG. 16 depicts a flow diagram of an exemplary method for forming a photomask pattern in accordance with various disclosed embodiments.

FIG. 16 depicts a flow diagram of an exemplary method (process) for forming a photomask pattern in accordance with various disclosed embodiments. FIGS. 1-6 depict the photomask pattern at various stages during the process in accordance with various disclosed embodiments. Note that although FIGS. 1-6 depict photomask patterns corresponding to the method depicted in FIG. 16, the photomask patterns and the method are not limited to one another in any manner.

Figure 1:
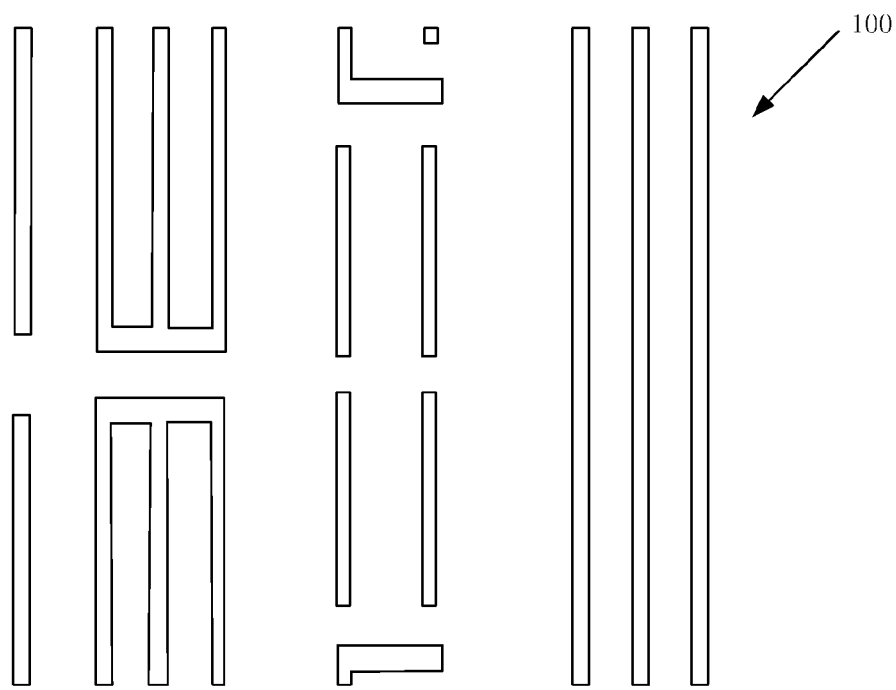
FIGS. 1-6 depict an exemplary photomask pattern at various stages during a process for forming a photomask pattern in accordance with various disclosed embodiments.

In Step S101 of FIG. 16 and referring to FIG. 1, a to-be-etched pattern 100 is provided. The to-be-etched pattern 100 can refer to a pattern that is to be formed via etching or any other appropriate processes.

In one embodiment, the to-be-etched pattern 100 can be an etching pattern of a polysilicon layer to be formed in the polysilicon layer via etching. The to-be-etched pattern 100 can include a plurality of elongated (i.e., strip-shaped) gate patterns, and pattern(s) that are vertically connected to the gate patterns. In another embodiment, the to-be-etched pattern 100 can include other to-be-etched patterns, or to-be-etched patterns of other material layer(s).

Figure 2:
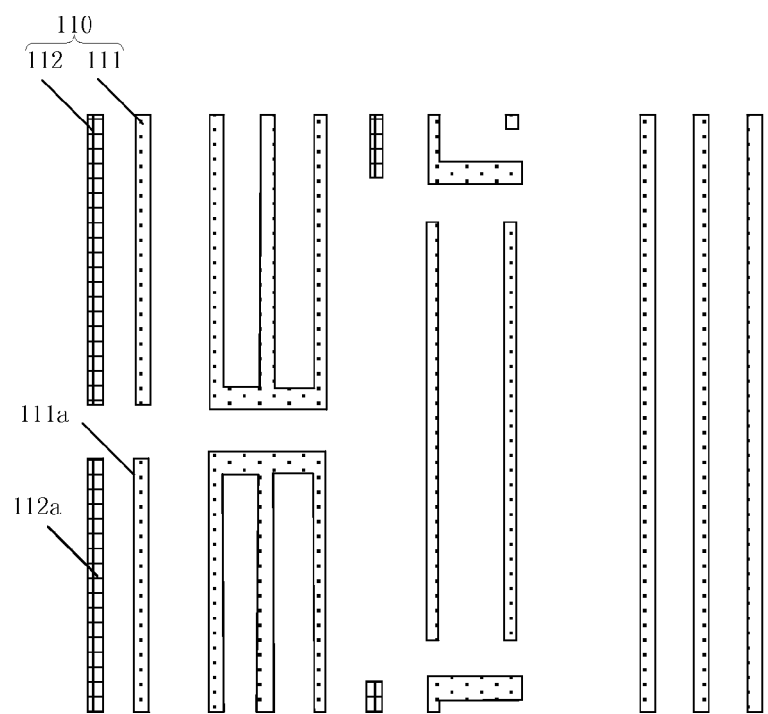
Figure 3:
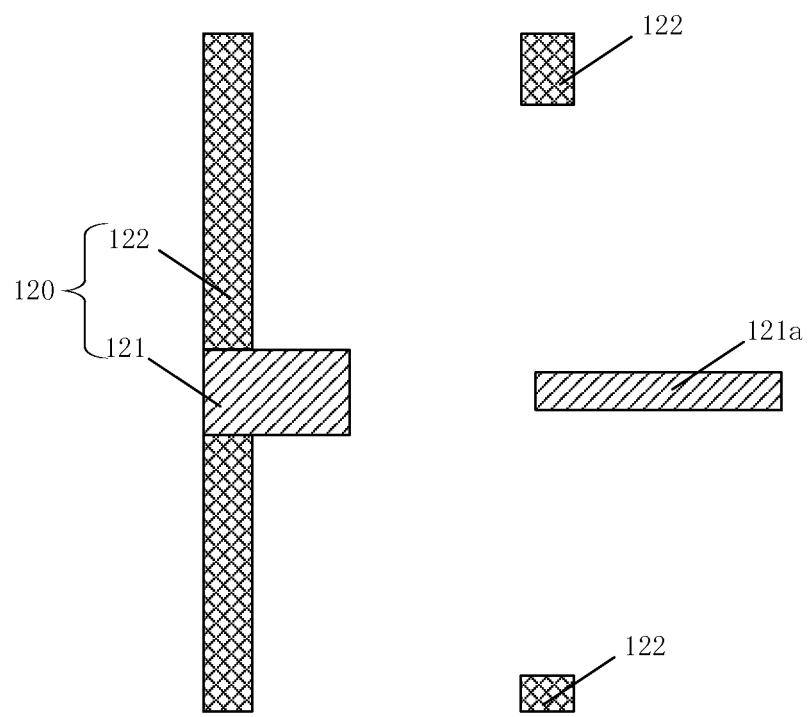

In Step S102 of FIG. 16 and referring to FIGS. 2-3, the to-be-etched pattern 100 is split or divided into a first mask pattern 110 and an initial second mask pattern 120. FIG. 2 depicts the first mask pattern 110. FIG. 3 depicts the initial second mask pattern 120.

For example, as shown in FIG. 2, the first mask pattern 110 can include a first pattern 111 and a first print scattering pattern 112. In FIG. 2, various types of pattern are depicted using various fill effects, respectively. That is, patterns having the same fill effect are patterns of the same type. For example, the first pattern 111 is indicated by a dotted fill effect, and the first print scattering pattern 112 is indicated by a grid fill effect. In addition, in various embodiments, in FIG. 2, the first pattern 111 and the first print scattering pattern 112 can be opaque on a photomask.

The first mask pattern 110 can be used as a photomask pattern during a first patterning process of a double patterning-etching process. Patterns of the first mask pattern 110 can be the patterns remaining in the photoresist layer during an exposure process.

The first pattern 111 is a primary pattern of the to-be-etched pattern 100, and can include the plurality of strip-shaped gate patterns and connection patterns that connect the gate patterns. The first print scattering pattern 112 can be located around isolated pattern(s) of the first pattern 111. As used herein, an isolated pattern refers to a pattern that is surrounded by an uneven pattern density, or a pattern that is surrounded by a pattern density different from the pattern density in other region(s) of the mask pattern that the isolated pattern belongs to.

In one example, an isolated pattern can have a relatively high pattern density on one side and a relatively low pattern density on the other side. In another example, an isolated pattern can be surrounded by a relatively low pattern density compared with other regions of the mask pattern that the isolated pattern belongs to.

As used herein, a region having a relatively high pattern density can be referred to as a high-density region. A region having a relatively low pattern density can be referred to as a low-density region.

In an example as shown in FIG. 2, the first pattern 111 includes a first pattern 111a. The pattern density of the first pattern 111 on both sides of the first pattern 111a has a relatively great difference. As shown in FIG. 2, before adding a first print scattering pattern 112a, the first pattern 111a has a certain portion of the first pattern 111 on one side, and no pattern on the other side. In other words, the first pattern 111a has a relatively high pattern density on one side, and a relatively low pattern density on the other side. Thus, the first pattern 111a is an isolated pattern.

The method for forming the first mask pattern 110 can include the following exemplary steps. The to-be-etched pattern 100 can be divided into the first pattern 111 and a second pattern. The first pattern 111 can be used as an initial first mask pattern. The first pattern 111 and the second pattern can be overlapped, i.e., superimposed, to form the to-be-etched pattern 100. The first print scattering pattern 112 can be added to the initial first mask pattern. The first pattern 111 and the first print scattering pattern 112 can form the first mask pattern 110.

For example, as shown in FIG. 2, the first print scattering pattern 112a can be added to the initial first mask pattern. Thus, the first mask pattern 110 can include the first pattern 111a and the first print scattering pattern 112a.

In one embodiment, the first pattern 111 can be a primary pattern of the to-be-etched pattern 100, and can include the plurality of strip-shaped gate patterns and connection patterns that connect the gate patterns. The second pattern can disconnect the strip-shaped gate patterns to form discrete gate patterns.

In various embodiments, disconnecting, cutting, or breaking a pattern can refer to introducing a gap in the pattern (e.g., by etching) to make the pattern discontinuous. For example, a strip-shaped gate pattern can be disconnected, cut, or broken into more than one discrete pattern.

After the initial first mask pattern is formed, the first print scattering pattern 112 can be added to region(s) having isolated pattern(s) and/or a low pattern density. During an exposure process, the first print scattering pattern 112 can make the pattern density of the regions having the isolated patterns and/or a low pattern density become more similar to the pattern density of regions having a high pattern density. Thus, the light intensity distribution during the exposure process can be improved. Accordingly, the problem of low patterning quality caused by uneven pattern density can be avoided. In addition, the process window of the regions having the isolated patterns and the low pattern density can thus match the process window of regions having a high pattern density. The process window can thus be improved.

The first print scattering pattern 112 can have a width ranging from about 30 nm to about 120 nm. A distance between the first print scattering pattern 112 and the first pattern 111 at one side of the first print scattering pattern 112 can range from about 50 nm to about 150 nm. A distance between adjacent first print scattering patterns 112 can range from about 30 nm to about 120 nm. The size of the first print scattering pattern 112 can be greater than the exposure threshold value (i.e., exposure threshold size). The exposure threshold size can be determined by the photolithography resolution. Thus, the first print scattering pattern 112 can be transferred to a to-be-etched material layer during the first patterning process. In addition, via a second patterning process, the first print scattering pattern 112 in the to-be-etched material layer can be removed, such that arrangement of patterns on the to-be-etched material layer is not affected.

In various embodiments, a to-be-etched material layer can refer to a material layer to be patterned using the patterning process including, e.g., a first patterning process and a second patterning process. For example, a to-be-etched material layer can be patterned via photolithography using a first patterning process and using a first mask pattern as a photomask, followed by etching or any other appropriate process. Next, the to-be-etched material layer can be further patterned via photolithography, using a second patterning process and using a second mask pattern as a photomask, followed by etching or any other appropriate process.

Referring to FIG. 3, the initial second mask pattern 120 can include a second pattern 121 and a third pattern 122. In FIG. 3, various types of pattern are depicted using various fill effects, respectively. That is, patterns having the same fill effect are the same type of patterns. The second pattern 121 and the third pattern 122 can be light-transmitting patterns on a photomask.

In some embodiments, a positive-tone photoresist layer can be used in photolithography during both the first patterning process and the second patterning process. In this case, in the first mask pattern 110, the first pattern 111 and the first print scattering pattern 112 can be opaque. Thus, after the first patterning process and an etching process, the first pattern 111 and the first print scattering pattern 112 can define the regions of the to-be-etched material layer that are covered by the photoresist and remain after the etching process. In the initial second mask pattern 120, the second pattern 121 and the third pattern 122 can be light-transmitting patterns. Thus, after the second patterning process and an etching process, a portion of the first pattern 111 overlapping with the second pattern 121 can have photoresist exposed and developed, and thus can be etched, such that the first pattern 111 can be cut by the second pattern 121 according to the design of the mask patterns.

Although a positive-tone photoresist layer is used in the above description, a negative-tone or any appropriate type of photoresist layer can be used. Although in the above description, both the first patterning process and the second patterning process may use a positive-tone photoresist layer, different tones of photoresist, or any appropriate combination of photoresist tones can be used during the first patterning process and the second patterning process.

The initial second mask pattern 120 can be used as an initial pattern of a photomask pattern during a second patterning process of the double patterning-etching process. The pattern of the initial second mask pattern 120 is the pattern to be removed from the photoresist layer during the exposure process.

In one embodiment, the second pattern 121 can be used for cutting off the strip-shaped gate patterns of the first pattern 111 of the first mask pattern 110 (referring to FIG. 2), and for removing the end portion of the strip-shaped gate patterns. The third pattern 122 can be used for removing the first print scattering pattern 112 of the first mask pattern 110.

The size of the third pattern 122 can be greater than the size of the first print scattering pattern 112, in order to ensure that the first print scattering pattern 112 can be removed completely.

The initial second mask pattern 120 has a relatively low pattern density and an uneven distribution of pattern density. In one embodiment, as shown in FIG. 3, the pattern density of the region where a second pattern 121a of the initial second mask pattern 120 is located is lower than the pattern density of other regions. The second pattern 121a is thus an isolated pattern. Subsequently, a second print scattering pattern can be formed on both sides of the second pattern 121a, to adjust the pattern density on both sides of the second pattern 121a.

Figure 4:
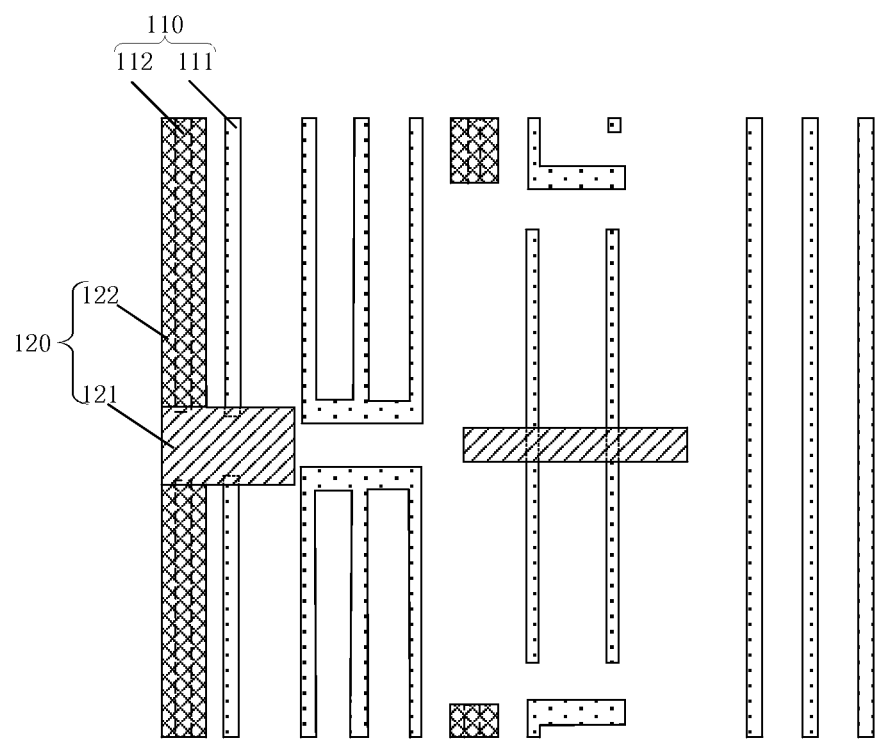

FIG. 4 depicts an overlapped pattern, i.e., a pattern formed by overlapping (i.e., overlaying) the first mask pattern 110 (referring to FIG. 2) and the initial second mask pattern 120 (referring to FIG. 3). Subsequently, via the overlapped pattern, the relationship between an initial print scattering pattern and the first mask pattern 110 can be determined. The initial print scattering pattern is a pattern to be added to the initial second mask pattern 120.

The third pattern 122 of the initial second mask pattern 120 can substantially completely cover the first print scattering pattern 112 of the first mask pattern 110. Thus, after the second patterning process, the first print scattering pattern 112 transferred to the to-be-etched material layer during the first patterning process can be completely removed.

Figure 5:
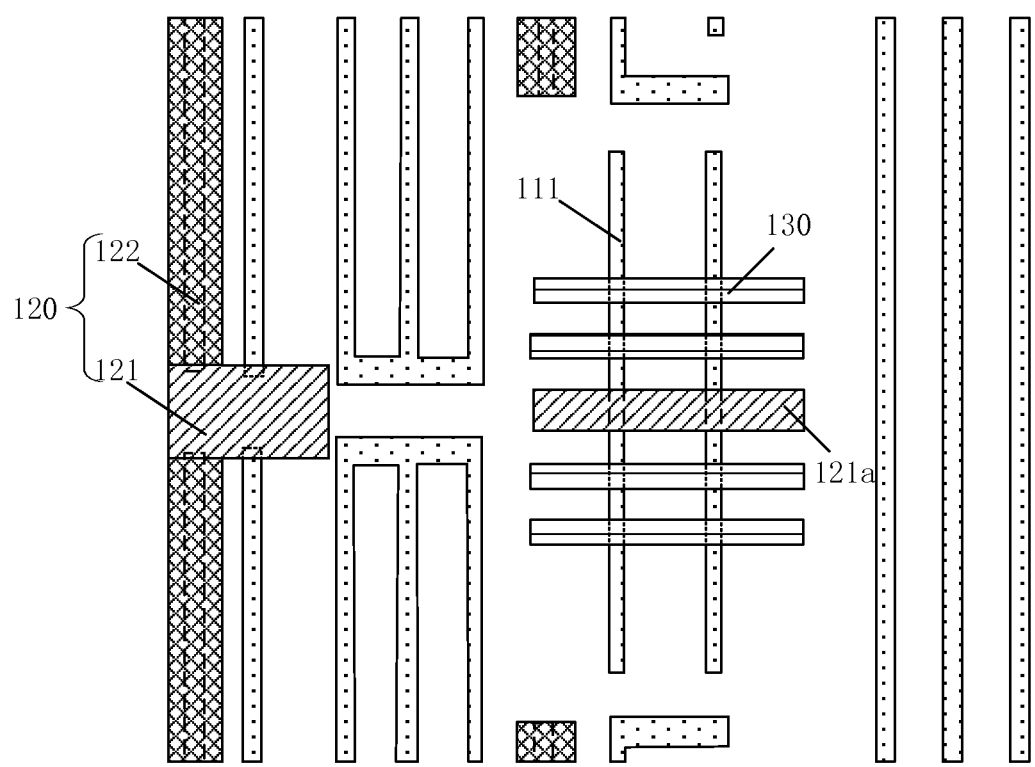

In Step S103 of FIG. 16 and referring to FIG. 5, an initial print scattering pattern 130 is added to the initial second mask pattern 120. According to parameters including, e.g., the preset width of the initial print scattering pattern 130, the distance between the initial print scattering pattern 130 and the second pattern 121, and/or the distance between adjacent initial print scattering patterns 130, the initial print scattering pattern 130 can be added to region(s) of the initial second mask pattern 120 that have a low pattern density. The parameters can be determined according to a certain rule that is determined by the specific photolithography process such as the photolithography equipment, design rule of the photomask pattern or any other appropriate aspects of the fabrication process.

For example, the preset width of the initial print scattering pattern 130 can range from about 30 nm to about 120 nm. The distance between the initial print scattering pattern 130 and the second pattern 121 can range from about 50 nm to about 150 nm. The distance between adjacent initial print scattering patterns 130 can range from about 30 nm to about 120 nm. The size of the initial print scattering pattern 130 can be relatively large, such that the initial print scattering pattern 130 can be transferred to a photoresist layer during an exposure process.

In one embodiment, the second pattern 121a of the initial second mask pattern 120 is located in a region having a relatively low pattern density. The initial print scattering pattern 130 can be located at both sides of the second pattern 121a. The number of the initial print scattering patterns 130 on one side of the second pattern 121a can be about 2, or any other appropriate value.

In one embodiment, the width of the initial print scattering pattern 130 can be about 60 nm. The distance between adjacent initial print scattering patterns 130 can be about 60 nm. The distance between the initial print scattering pattern 130 and the second pattern 121a can be greater than or equal to about 80 nm. The length of the initial print scattering pattern 130 can be substantially the same as the length of the second pattern 121a.

The initial print scattering pattern 130 and the first pattern 111 of the first mask pattern 110 can have an overlapping portion. That is, a portion of the initial print scattering pattern 130 can overlap with a portion of the first pattern 111. During the second patterning process, the pattern transferred from the initial print scattering pattern 130 to the to-be-etched material layer can damage the pattern transferred to the to-be-etched material layer during the first patterning process. Therefore, the portion of the initial print scattering pattern 130 overlapping with the first pattern 111 may need to be removed.

Figure 6:
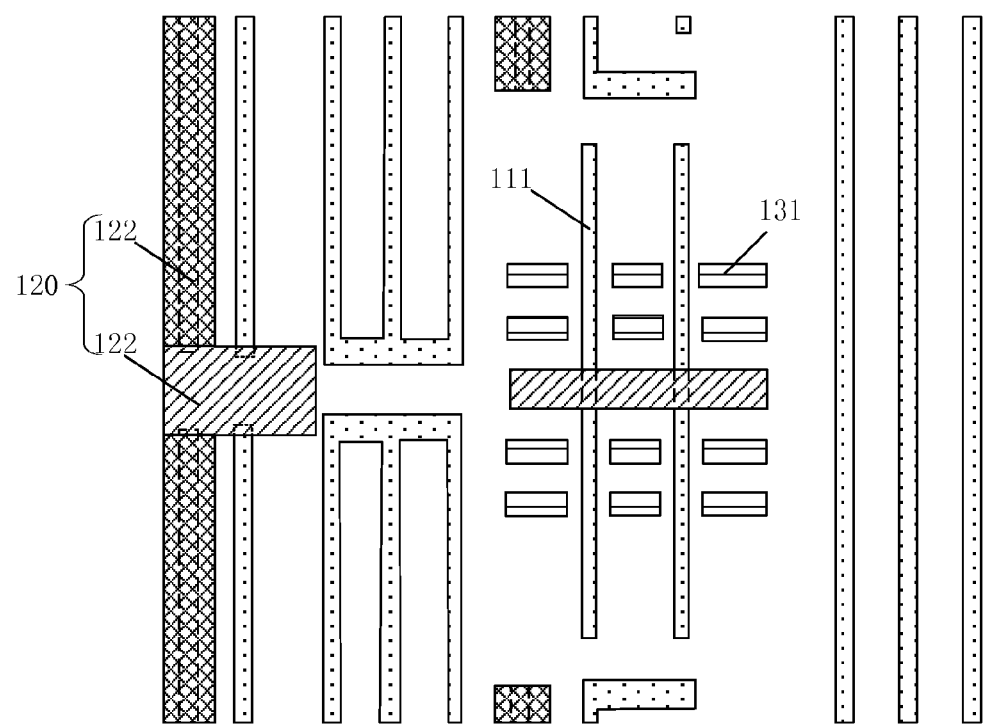

In Step S104 of FIG. 16 and referring to FIG. 6, optionally, the portion of the initial print scattering pattern 130 (referring to FIG. 5) overlapping with the first pattern 111 is removed. The initial print scattering pattern 130 that remains can be referred to as an initial second print scattering pattern 131, or an initial print scattering pattern 131.

After removing the portion of the initial print scattering pattern 130 overlapping with the first pattern 111, the position(s) of the initial print scattering pattern 131 can be separated from the positions of the first pattern 111. The initial print scattering pattern 131 does not overlap with the first pattern 111. That is, the positions of the initial print scattering pattern 131 do not overlap with the positions of the first pattern 111. Therefore, during the patterning process using the initial print scattering pattern 131 as a photomask pattern, the pattern formed by the first patterning process is not damaged.

In addition, the distance between adjacent initial print scattering patterns 131 can range from about 30 nm to about 120 nm. Thus, after exposing the adjacent initial print scattering patterns 131, the obtained exposed patterns are not adhered with each other.

In certain embodiments, after removing the portion of the initial print scattering pattern 130 overlapping with the first pattern 111, the size of some or all of the remaining initial print scattering pattern 131 may be too small, such that the initial print scattering pattern 131 may not form exposed patterns on the photoresist layer. Therefore, in Step S105 of FIG. 16, after forming the initial print scattering pattern 131, a portion of initial print scattering pattern 131 that have length and width smaller than a preset size can optionally be removed (not shown). The preset size can be a minimum size of the second mask pattern (e.g., the initial second mask pattern 120) that can be exposed. Thus, it can be ensured that the remaining initial print scattering pattern 131, after removing a portion of the initial print scattering pattern 131, can be exposed and formed on the photoresist layer. The preset size can range from about 20 nm to about 120 nm.

In one embodiment, the preset size can be about 20 nm. In one embodiment, the width and length of the remaining initial print scattering pattern 131 can be both greater than the preset size. Therefore, the initial print scattering pattern 131 that remains can be used as, and be referred to as, the second print scattering pattern 131. Thus, a second mask pattern can be obtained. The second mask pattern can include the second pattern 121, the third pattern 122, and the second print scattering pattern 131.

In various embodiments, the second mask pattern can be a pattern formed on a second photomask to be used in a second patterning process of the double patterning process. The first mask pattern can be a pattern formed on a first photomask to be used in a first patterning process of the double patterning process.

In other embodiments, a process for removing a portion of the initial print scattering pattern that have length and width smaller than the preset size can include the following steps. The length and width of the initial print scattering pattern can be both reduced by the preset size, to cause the portion of the initial print scattering pattern to disappear. Next, the length and width of the remaining initial print scattering pattern can be both increased by the preset size, to be restored to the original size.

The second mask pattern can include print scattering pattern, i.e., the second print scattering pattern 131. Thus, during the second patterning process using the second mask pattern as a photomask pattern, the print scattering pattern can be transferred to the to-be-etched material layer. However, because the positions of the print scattering pattern do not overlap with the positions of the patterns of the first mask pattern 110, the pattern formed on the to-be-etched material layer during the first patterning process is not affected. The print scattering pattern does not need to be subsequently removed. Thus, no additional processes need to be added.

In Step S106 of FIG. 16, optionally, a non-print scattering pattern is added to the second mask pattern (not shown). In some embodiments, the non-print scattering pattern can be added to the second mask pattern. In other embodiments, the non-print scattering pattern can be added. Whether the second mask pattern includes the non-print scattering pattern can be determined based on actual needs of application and design rules of the photomask, without limitation.

In another embodiment, after the second print scattering pattern is formed, a non-print scattering pattern can be further added to the initial second mask pattern. The method as shown in FIG. 16 can be further illustrated by another example as follows. FIGS. 7-11 depict another exemplary photomask pattern at various stages during a process for forming a photomask pattern in accordance with various disclosed embodiments. Note that although FIGS. 7-11 depict photomask patterns corresponding to the method depicted in FIG. 16, the photomask patterns and the method are not limited to one another in any manner.

Figure 7:
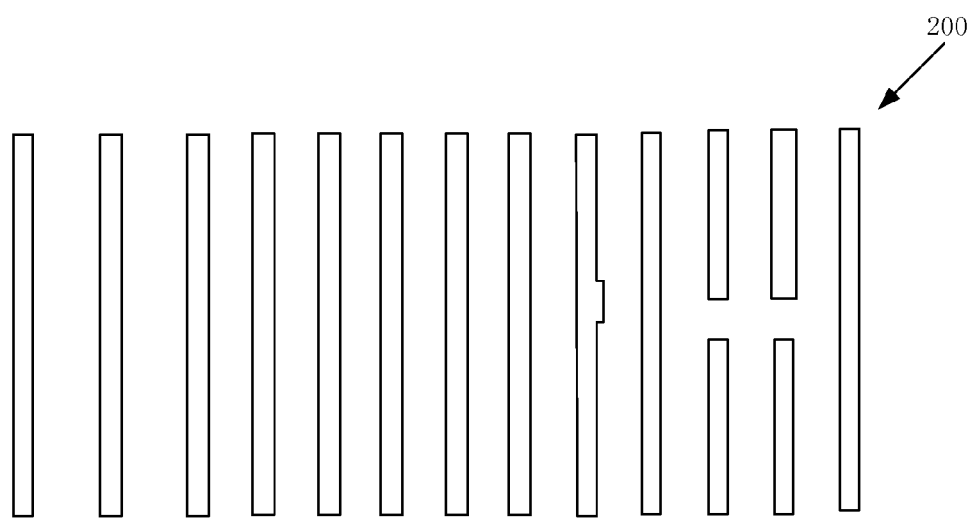
FIGS. 7-11 depict another exemplary photomask pattern at various stages during a process for forming a photomask pattern in accordance with various disclosed embodiments.

In Step S101 of FIG. 16 and referring to FIG. 7, a to-be-etched pattern 200 is provided. The to-be-etched pattern 200 can include a plurality of strip-shaped patterns that have a parallel arrangement. In order to improve the accuracy and uniformity of the size of the end portion of the strip-shaped patterns, the to-be-etched pattern 200 can be formed in a to-be-etched material layer by two patterning processes using a double patterning method.

Figure 8:
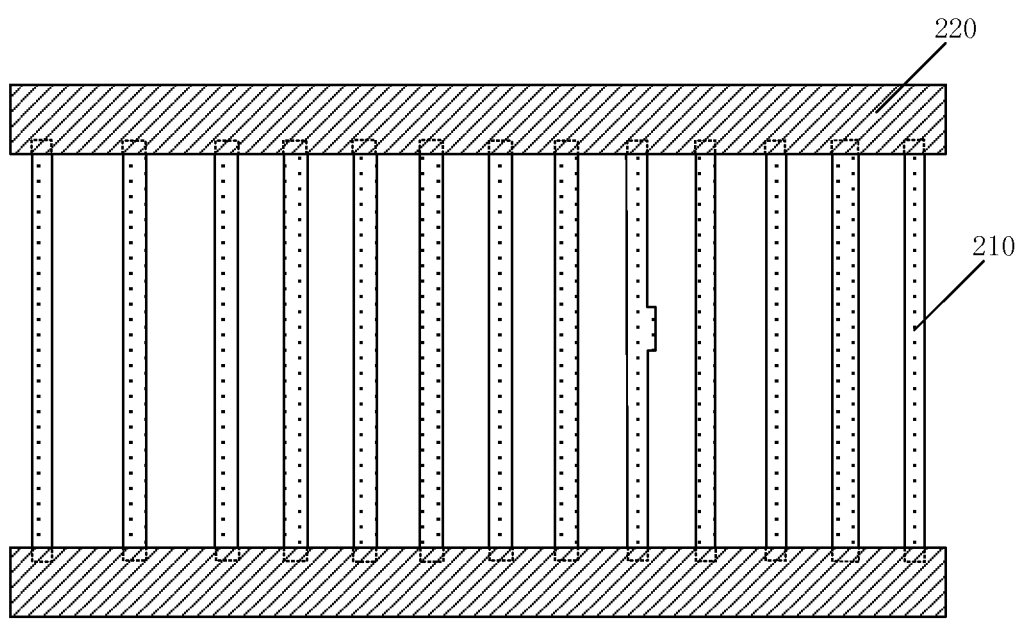

In Step S102 of FIG. 16 and referring to FIG. 8, the to-be-etched pattern 200 (referring to FIG. 7) can be divided into a first mask pattern and an initial second mask pattern. FIG. 8 depicts an overlapped pattern, i.e., a pattern formed by overlapping (i.e., overlaying) the first mask pattern and the initial second mask pattern.

The first mask pattern can include a first pattern 210. The length of the first pattern 210 can be greater than the length of the to-be-etched pattern 200.

The initial second mask pattern can include a second pattern 220. The initial second mask pattern can cover both ends of the first pattern 210, and can be used for removing a portion of the length of the first pattern 210 at both ends of the first pattern 210, such that the size of the remaining first pattern 210 can be substantially the same as the length of the corresponding pattern in the to-be-etched pattern 200. The first pattern 210 is previously transferred to the to-be-etched material layer via a first patterning process. Thus, In addition, compared with forming the to-be-etched pattern 200 directly using one patterning process, by using the initial second mask pattern for removing a portion of the first pattern 210, the size of both ends of the pattern formed after etching can be more uniform and the size of the pattern formed after etching can be more accurate.

The region(s) where the second pattern 220 of the initial second mask pattern can have a relatively low pattern density. Thus, a print scattering pattern can be added to both sides of the second pattern 220, to adjust the pattern density of the initial second mask pattern and thus improve process window.

Figure 9:
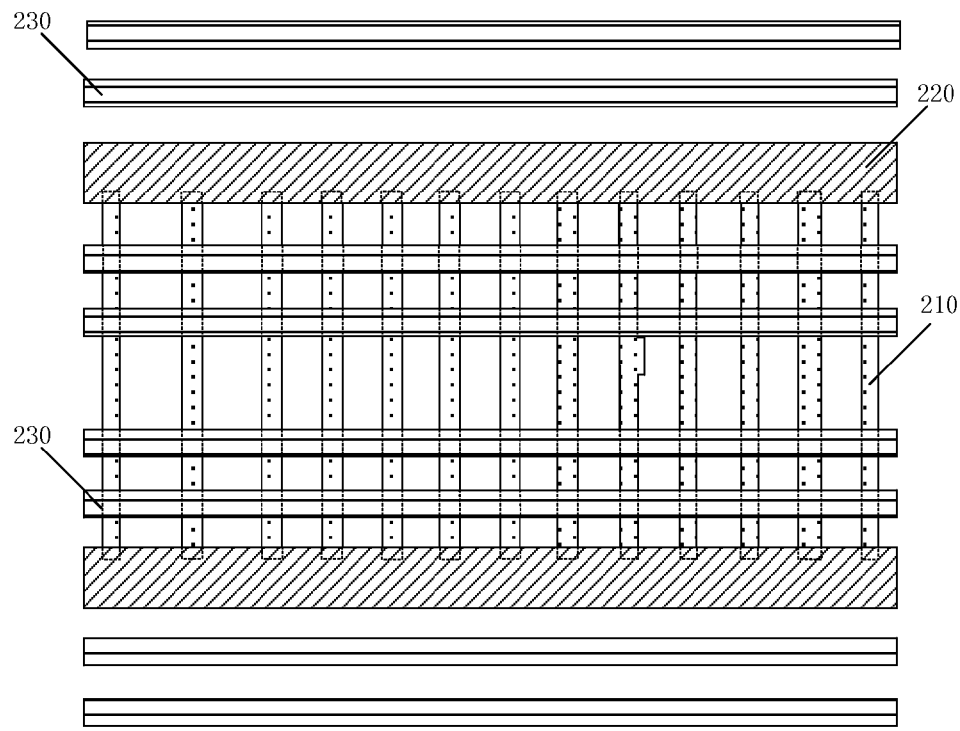

In Step S103 of FIG. 16 and referring to FIG. 9, an initial print scattering pattern 230 is added to both sides of the second pattern 220. The initial print scattering pattern 230 can have a rectangular shape. The length of the initial print scattering pattern 230 can be substantially the same as the length of the second pattern 220.

According to parameters including, e.g., the preset width of the initial print scattering pattern 230, the distance between the initial print scattering pattern 230 and the second pattern 220, and/or the distance between adjacent initial print scattering patterns 230, the initial print scattering pattern 230 can be added to a second region (i.e. low-density region) of the initial second mask pattern. For example, the preset width of the initial print scattering pattern 230 can range from about 30 nm to about 120 nm. The distance between the initial print scattering pattern 230 and the second pattern 220 can range from about 50 nm to about 150 nm. The distance between adjacent initial print scattering patterns 230 can range from about 30 nm to about 120 nm. A portion of the initial print scattering pattern 230 can overlap with a portion of the first pattern 210. That is the positions(s) of a portion of the initial print scattering pattern 230 may overlap with the positions(s) of a portion of the first pattern 210.

Figure 10:
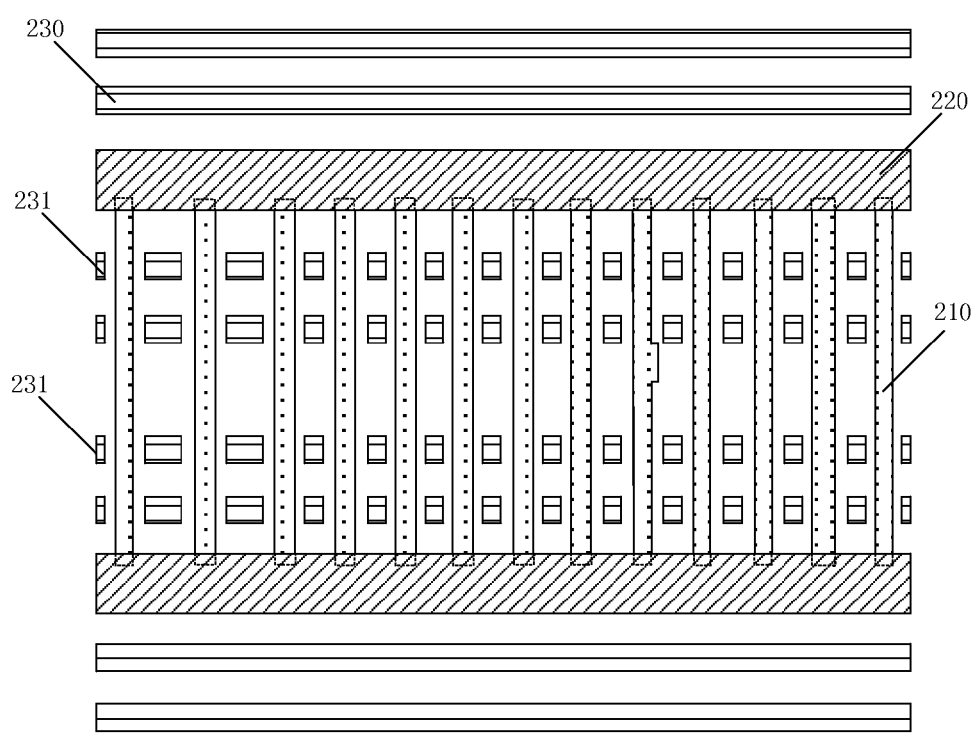

In Step S104 of FIG. 16 and referring to FIG. 10, optionally, the portion of the initial print scattering pattern 230 overlapping with the first pattern 210 is removed. After the portion of the initial print scattering pattern 230 overlapping with the first pattern 210 is removed, a discontinuous or discrete initial print scattering pattern 231 can be formed, and in other words, the discrete initial print scattering pattern 231 is the portion of the initial print scattering pattern 230 that becomes discontinuous or discrete after the removing. In addition, the distance between adjacent initial print scattering patterns 231 can range from about 30 nm to about 120 nm.

Because the distance between adjacent first patterns 210 can be relatively small, the size of the discrete initial print scattering patterns 231 can be smaller than a preset size. The discrete initial print scattering patterns 231 may need to be removed in subsequent steps.

For illustrative purposes, in one example, assuming the size (i.e., width and length) of all the discrete initial print scattering patterns 231 is smaller than a preset size. In this case, the discrete initial print scattering patterns 231 need to be removed in subsequent steps. In this case, the remaining initial print scattering pattern 230 does not include the discrete initial print scattering patterns 231.

In another example, assuming the size (i.e., width and length) of a portion of the discrete initial print scattering pattern 231 is smaller than a preset size. In this case, the portion of the discrete initial print scattering pattern 231 needs to be removed in subsequent steps. In this case, the remaining initial print scattering pattern 230 can include the discrete initial print scattering patterns 231 that have width or length greater than a preset size and thus have not been removed.

Figure 11:
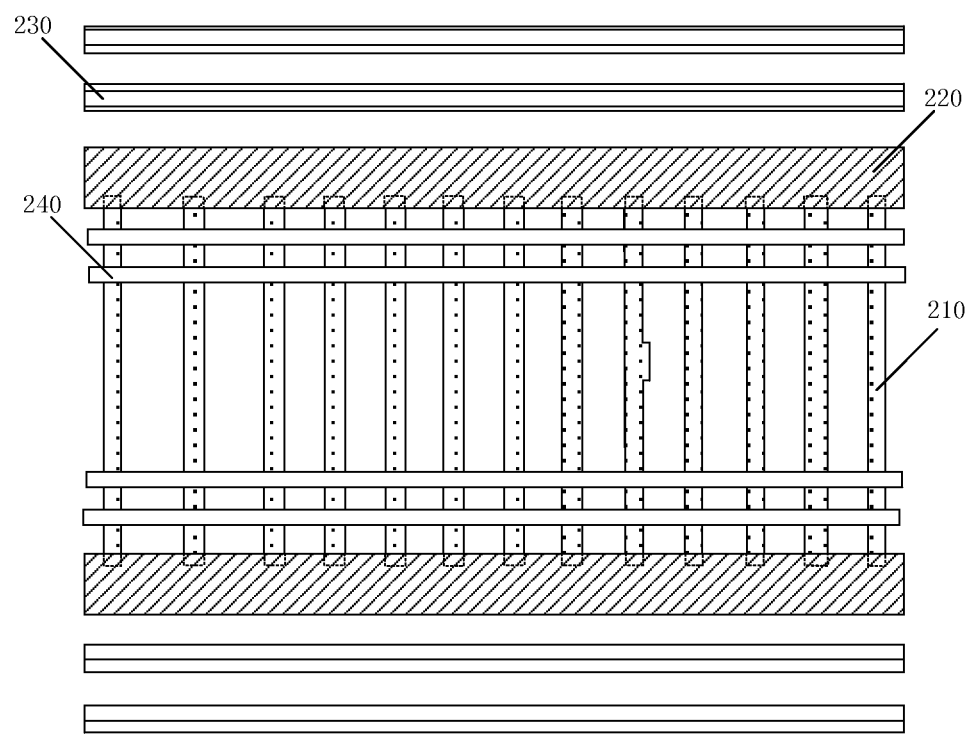

In Step S105 of FIG. 16 and referring to FIG. 11, optionally, the discrete initial print scattering patterns 231 are removed. In Step S106 of FIG. 16 and referring to FIG. 11, optionally, a non-print scattering pattern 240 is added to the second pattern 220 (or the initial second mask pattern). The non-print scattering pattern 240, the initial print scattering pattern 230 that remains, and the second pattern 220 can form a second mask pattern.

For example, a method (or process) for removing the discrete initial print scattering pattern 231 (referring to FIG. 10) can include the following steps. The length and width of the initial print scattering pattern 230 and the discrete initial print scattering pattern 231 can be both reduced by the preset size. Because the size of the discrete initial print scattering pattern 231 is smaller than a preset size, the discrete initial print scattering pattern 231 can thus disappear. Next, the length and width of the remaining initial print scattering pattern 230 can be both increased by the preset size, to be restored to the original size. The preset size can range from about 20 nm to about 120 nm.

After the discrete initial print scattering pattern 231 is removed, pattern density on both sides of the second pattern 220 may be uneven. For example, the pattern density on one side of the second pattern 220 may be substantially different from the pattern density on the other side of the second pattern 220. Thus, pattern accuracy during exposing the second pattern 220 may be affected.

In one embodiment, a non-print scattering pattern 240 can be added on the other side of the second pattern 220. For example, the non-print scattering pattern 240 can have the initial print scattering pattern 230 on one side, and the non-print scattering pattern 240 on the other side. That is, the non-print scattering pattern 240 can be added onto a side of the second pattern 220, such that the pattern density on both sides of the second pattern 220 can become substantially even. The size of non-print scattering pattern 240 can be smaller than the exposure threshold size. The exposure threshold size can be determined by the photolithography resolution.

According to parameters including, e.g., the preset width of the non-print scattering pattern 240, the distance between the non-print scattering pattern 240 and the second pattern 220, and/or the distance between the non-print scattering pattern 240 and the initial print scattering pattern 230, the non-print scattering pattern 240 can be added to the second mask pattern. For example, the preset width of the non-print scattering pattern 240 can range from about 10 nm to about 50 nm. The distance between the non-print scattering pattern 240 and the second pattern 220 can range from about 30 nm to about 100 nm. The distance between the non-print scattering pattern 240 and the initial print scattering pattern 230 can range from about 20 nm to about 80 nm.

In one embodiment, the non-print scattering pattern 240 can have a rectangular shape. The length of the non-print scattering pattern 240 can be substantially the same as the length of the second pattern 220. The number of the non-print scattering pattern 240 on one side of the second pattern 220 can be about 2. In another embodiment, the number of the non-print scattering pattern 240 on one side of the second pattern 220 can be any other appropriate value greater than 2.

Although a portion of the non-print scattering pattern 240 can overlap with a portion of the first pattern 210, because the size of non-print scattering pattern 240 is smaller than the exposure threshold size, the non-print scattering pattern 240 is not transferred to the photoresist layer during an exposure process. That is, the non-print scattering pattern 240 does not appear on the photoresist layer after the exposure process. Thus, during a patterning process, the non-print scattering pattern 240 does not damage the exposed patterns on the to-be-etched material layer.

Further, the non-print scattering pattern 240 can adjust the pattern density on both sides of the second pattern 220 to a certain extent, such that the process window of photolithography using the second mask pattern as a photomask pattern can be improved. In various embodiments, the second mask pattern can include the non-print scattering pattern 240, the initial print scattering pattern 230, and the second pattern 220. In this case, the initial print scattering pattern 230 that remains to form the second mask pattern can also be referred to as a second print scattering pattern 230, or a print scattering pattern 230.

The method as shown in FIG. 16 can be further illustrated by another example as follows. FIGS. 12-15 depict another exemplary photomask pattern at various stages during a process for forming a photomask pattern in accordance with various disclosed embodiments. Note that although FIGS. 12-15 depict photomask patterns corresponding to the method depicted in FIG. 16, the photomask patterns and the method are not limited to one another in any manner.

Figure 12:
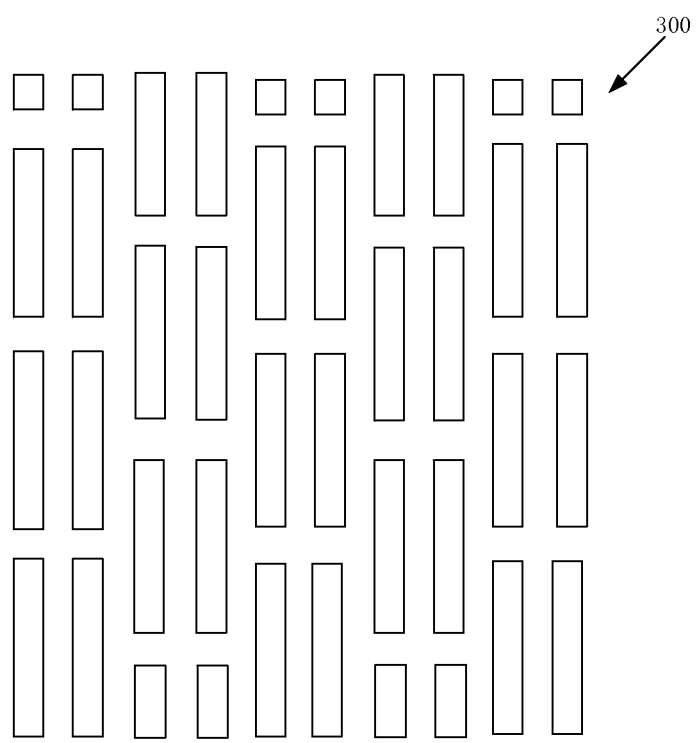
FIGS. 12-15 depict another exemplary photomask pattern at various stages during a process for forming a photomask pattern in accordance with various disclosed embodiments.

In Step S101 of FIG. 16 and referring to FIG. 12, a to-be-etched pattern 300 is provided. The to-be-etched pattern 300 can include a plurality of strip-shaped patterns that are discrete and have a parallel arrangement. The to-be-etched pattern 300 can include multiple columns. One column can include multiple strip-shaped patterns. The end portion of the strip-shaped patterns can be adjacent. For example, an end portion of a first strip-shaped pattern can be located adjacent to an end portion of a second strip-shaped pattern next to the first strip-shaped pattern.

Figure 13:
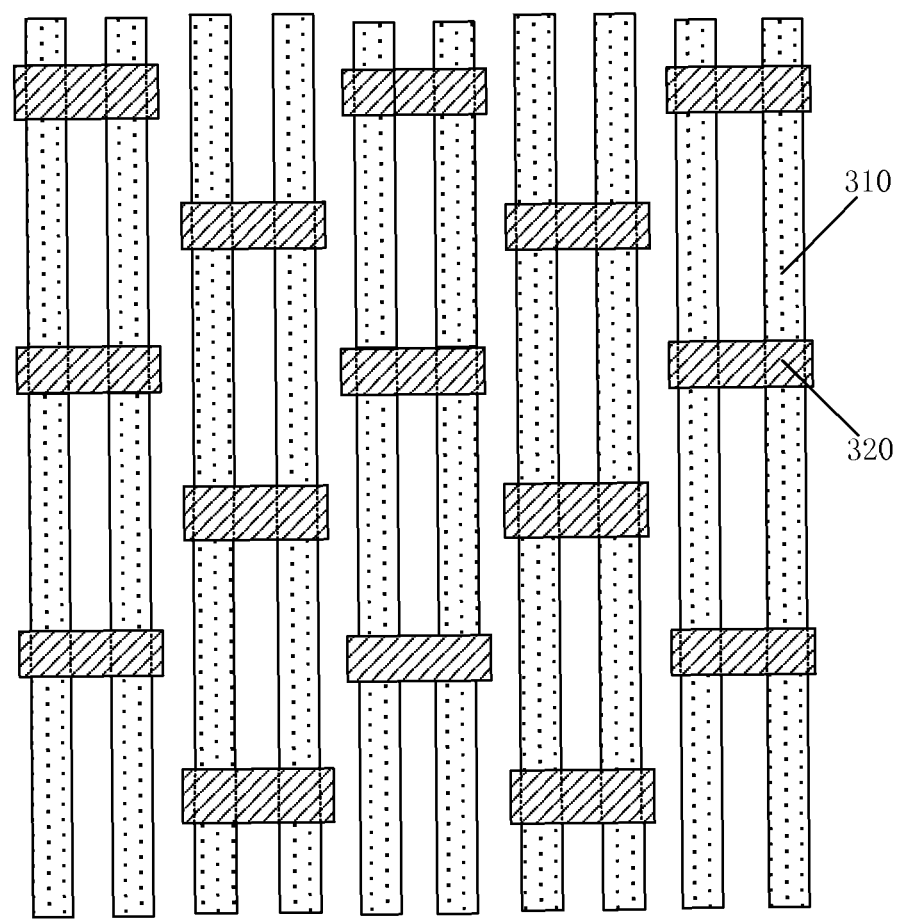

In Step S102 of FIG. 16 and referring to FIG. 13, the to-be-etched pattern 300 can be divided into a first mask pattern and an initial second mask pattern. The first mask pattern can include a first pattern 310. The initial second mask pattern can include a second pattern 320.

The first pattern 310 can include a plurality of strip-shaped patterns that have a parallel arrangement. The second pattern 320 overlap with a portion of the first pattern 310, such that the second pattern 320 can disconnect or break the first pattern 310, to form the to-be-etched pattern 300.

Figure 14:
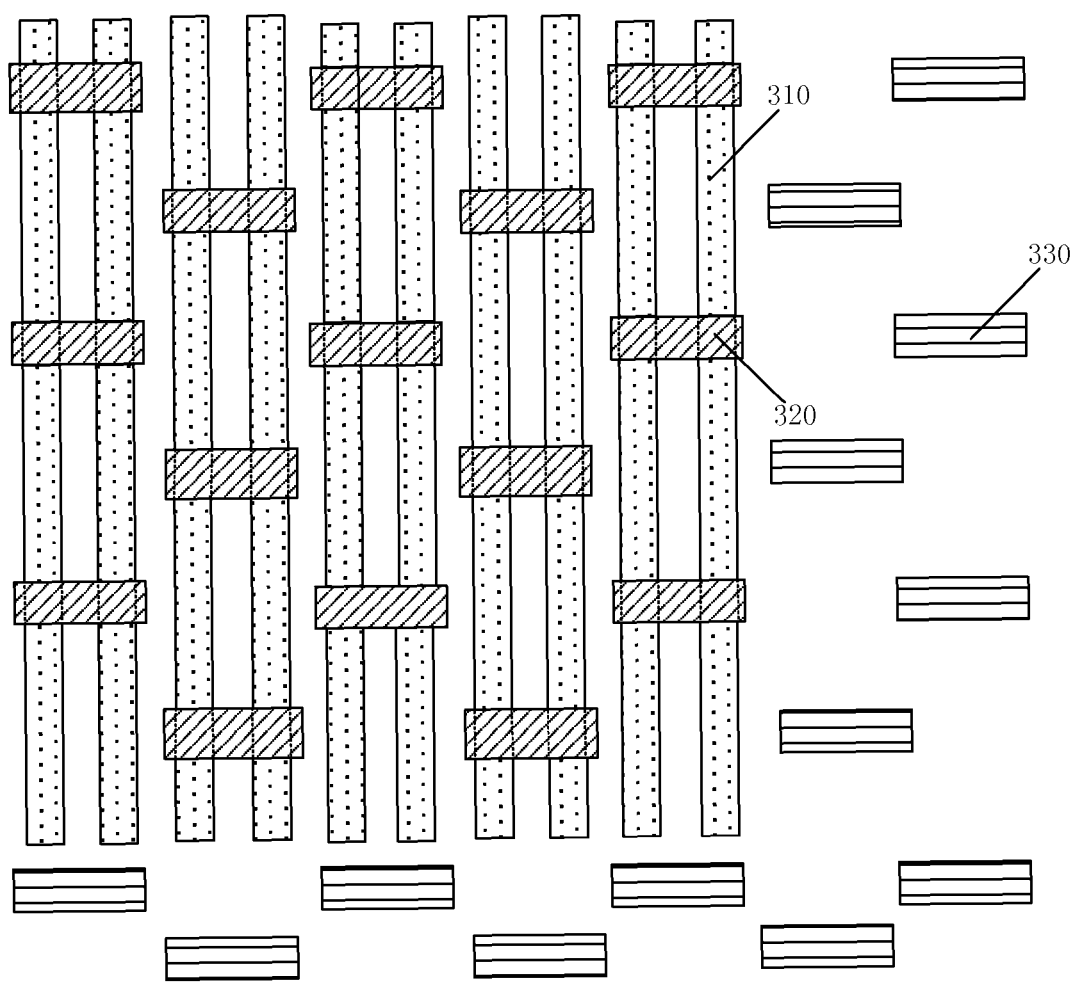

In Step S103 of FIG. 16 and referring to FIG. 14, an initial print scattering pattern 330 is added to the initial second mask pattern.

The region(s) where the second pattern 320 are densely distributed, i.e., the dense regions, can have a relatively uniform pattern density. However, the outmost second patterns 320 of the dense regions do not have other patterns on the other side. That is, an outmost second pattern 320 can have the dense region on one side and have no other patterns on the other side. Thus, the outmost second pattern 320 can have an open area on the other side. The open area can refer to an area having no other patterns. The initial print scattering pattern 330 can be added to the open area, such that the second pattern 320 located at the outmost portion of the dense regions can have a pattern density that is substantially the same on both sides of the second pattern 320.

The length of the initial print scattering pattern 330 can be substantially the same as the length of the second pattern 320 adjacent to the initial print scattering pattern 330. The width of the initial print scattering pattern 330 can range from about 30 nm to about 120 nm. The distance between the initial print scattering pattern 330 and the second pattern 320 can range from about 50 nm to about 150 nm. The distance between adjacent initial print scattering patterns 330 can range from about 30 nm to about 120 nm.

In the example as shown in FIG. 14, the position(s) of the initial print scattering pattern 330 does not overlap with the positions of the first pattern 310. Thus, the initial print scattering pattern 330 can be directly used as a second print scattering pattern 330.

Figure 15:
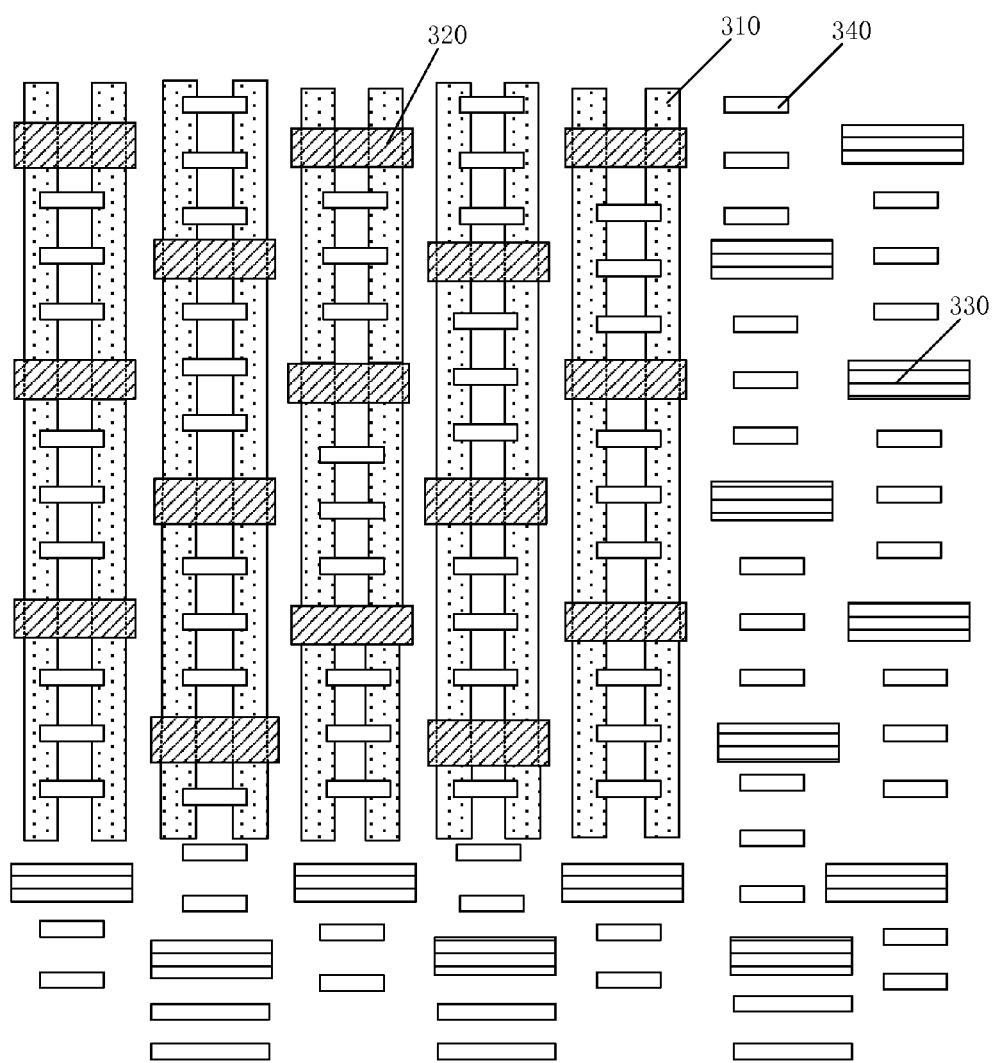

In Step S106 of FIG. 16 and referring to FIG. 15, optionally, a non-print scattering pattern 340 is added to the initial second mask pattern. Because the distance between a second pattern 320 and a second print scattering pattern 330 that are adjacent can be relatively large, in order to improve resolution of the photolithography and uniformity of light intensity distribution during the exposure process, a non-print scattering pattern 340 can be added between the second pattern 320 and the second print scattering pattern 330. The size of non-print scattering pattern 340 can be smaller than the exposure threshold size. The exposure threshold size can be determined by the photolithography resolution.

For example, the width of the non-print scattering pattern 340 can range from about 10 nm to about 50 nm. The distance between the non-print scattering pattern 340 and the second pattern 320 that is adjacent can range from about 30 nm to about 100 nm. The distance between the non-print scattering pattern 340 and the second print scattering pattern 330 that is adjacent can range from about 20 nm to about 80 nm.

In various embodiments, the eventually-formed second mask pattern can include the non-print scattering pattern 340, the second pattern 320 and the second print scattering pattern 330.

In various embodiments disclosed herein, a to-be-etched pattern can be split into a first mask pattern and an initial second mask pattern. A second print scattering pattern can be added to a low-density region of the initial second mask pattern. The second print scattering pattern can adjust the pattern density of a subsequently-formed second mask pattern. Thus, the problem of inaccurate size of exposed patterns caused by uneven pattern density can be avoided. In addition, the process window of photolithography using the second mask pattern as a photomask pattern can be improved.

Further, the position of the second print scattering pattern and the position of the first pattern of first mask pattern can be separated and do not overlap with each other. Therefore, after a pattern is formed on a to-be-etched material layer by a first patterning process using the first mask pattern as a photomask pattern, the pattern is not affected by the second print scattering pattern during a second patterning process.

Moreover, after the second patterning process using the second print scattering pattern as a photomask pattern, the second print scattering pattern is not retained on the to-be-etched material layer. Therefore, additional processes are not needed to remove the second print scattering pattern. In various embodiments, the second mask pattern can define the portion of the previously-formed first mask pattern that is to be etched. In this case, because the second print scattering pattern of the second mask pattern does not overlap with the first mask pattern, the second print scattering pattern is transferred to the photoresist layer but does not subsequently result in an etched pattern in the to-be-etched material layer. Therefore, no additional processes are needed to remove the second print scattering pattern.

In various embodiments, the forming of the second print scattering pattern can include the following exemplary steps.

The initial second mask pattern can be divided into a first region and a second region. The pattern density of the second region can be lower than the pattern density of the first region. An initial print scattering pattern can be added to the second region. Optionally, a portion of the initial print scattering pattern that overlaps with the first mask pattern can be removed. Optionally, a portion of the initial print scattering pattern that has both of a width and a length smaller than a preset size can be removed. The preset size can be a minimum size of the second mask pattern that can be exposed. The initial print scattering pattern that remains can form the second print scattering pattern. Optionally, the second print scattering pattern can have a rectangular shape.

Various embodiments also provide a photomask pattern. The photomask pattern can include a first mask pattern that can be formed on a first photomask, and a second mask pattern that can be formed on a second photomask. The first mask pattern can include a first pattern. The second mask pattern can include an initial second mask pattern that includes a second pattern. The first pattern and the second pattern can be combined to form a to-be-etched pattern. The second mask pattern can further include a second print scattering pattern.

Optionally, the second print scattering pattern does not overlap with the first pattern. Optionally, at least one of a length and a width of the second print scattering pattern is greater than a preset size. The preset size can be a minimum size of the second mask pattern that can be exposed. Therefore, in various embodiments, the second print scattering pattern may include one or more patterns, and the one or more patterns each can have at least one of a width or a length greater than a preset size.

Optionally, the second mask pattern can further include a non-print scattering pattern. The size of non-print scattering pattern can be smaller than the exposure threshold size. The exposure threshold size can be determined by the photolithography resolution. Further details of the photomask pattern as disclosed herein can be similar to the same as described in various embodiments (e.g., FIGS. 1-16).

In certain embodiments, methods for forming a photomask pattern are provided. The photomask pattern can be used for forming a polysilicon patterning and etching process for 20/28 nm process node. A print scattering pattern can be added to a second mask pattern. For example, the print scattering pattern can be a print scattering bar, i.e., bar-shaped.

In an exemplary process, rules for adding a print scattering pattern can be first set. The rules can include preset parameters, e.g., the size of the print scattering pattern, distance between the print scattering pattern and the main patterns (i.e., the first pattern and/or the second pattern), distance between adjacent print scattering patterns, or a combination thereof. The rules can be varied depending on specific regions of the mask. Other rules can be included.

The portion of the print scattering pattern that overlaps with the first pattern can be removed. A portion of the initial print scattering pattern that has both of a width and a length smaller than a preset size can be removed. The preset size can be about half of a minimum width on the second mask pattern that can be exposed. In an exemplary removal process, the length and width of the initial print scattering pattern can be both reduced by the preset size, to cause the portion of the initial print scattering pattern to disappear. Next, the length and width of the remaining initial print scattering pattern can be both increased by the preset size, to be restored to the original size. A non-print scattering pattern can be further added according to the rules. In various embodiments, the print scattering pattern can be used for adjusting pattern density of the second mask pattern.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a photomask pattern, comprising:
   providing a to-be-etched pattern;
   providing a first mask pattern on a first photomask and including one or more first patterns corresponding to a portion of the to-be-etched pattern, and further including a first print scattering pattern on a side of the one or more first patterns;
   providing an initial second mask pattern including one or more second patterns, and a third pattern, wherein the third pattern in the initial second mask pattern corresponds to the first print scattering pattern of the first mask pattern such that: when overlaying the initial second mask pattern on the first mask pattern, the third pattern substantially overlaps with the first print scattering pattern;
   overlaying the initial second mask pattern on the first mask pattern; and
   forming a second print scattering pattern and adding the second print scattering pattern to the initial second mask pattern, after overlaying on the first mask pattern, to form the photomask pattern on a second photomask, a position of the second print scattering pattern being separated from a position of the one or more first patterns of the first mask pattern overlapped with the initial second mask pattern.

2. The method according to claim 1, wherein the forming of the second print scattering pattern includes:
   dividing the initial second mask pattern into a first region and a second region, a pattern density of the second region being lower than a pattern density of the first region;
   adding an initial print scattering pattern to the second region of the initial second mask pattern;
   removing a portion of the initial print scattering pattern that overlaps with the position of the one or more first patterns of the first mask pattern;
   removing a portion of the initial print scattering pattern that has both of a width and a length smaller than a preset size, the preset size being a minimum size of the second mask pattern that can be exposed; and
   forming the second print scattering pattern using the initial print scattering pattern that remains.

3. The method according to claim 2, wherein the removing of the portion of the initial print scattering pattern that has both of a width and a length smaller than the preset size includes:
   reducing both of a length and a width of the initial print scattering pattern by the preset size, to cause the portion of the initial print scattering pattern to disappear; and
   increasing both of the length and the width of the remaining initial print scattering pattern by the preset size, to restore the remaining initial print scattering pattern to an original size.

4. The method according to claim 2, wherein the preset size ranges from about 20 nm to about 120 nm.

5. The method according to claim 2, wherein the adding of the initial print scattering pattern to the second region includes:

adding the initial print scattering pattern to the second region according to a preset width of the initial print scattering pattern, a distance between the initial print scattering pattern and the one or more second patterns, a distance between adjacent initial print scattering patterns, or a combination thereof.

6. The method according to claim 5, wherein:
the preset width of the initial print scattering pattern ranges from about 30 nm to about 120 nm;
the distance between the initial print scattering pattern and the one or more second patterns ranges from about 50 nm to about 150 nm; and
the distance between the adjacent initial print scattering patterns ranges from about 30 nm to about 120 nm.

7. The method according to claim 5, wherein the initial print scattering pattern has a rectangular shape.

8. The method according to claim 1, wherein the second print scattering pattern has a rectangular shape.

9. The method according to claim 1, further including:
after adding the second print scattering pattern, adding a non-print scattering pattern to the initial second mask pattern after overlaid on the first mask pattern.

10. The method according to claim 9, wherein the non-print scattering pattern has a size smaller than an exposure threshold size.

11. The method according to claim 9, wherein the adding of the non-print scattering pattern to the initial second mask pattern includes:
adding the non-print scattering pattern to the initial second mask pattern according to a preset width of the non-print scattering pattern, a distance between the non-print scattering pattern and the one or more second patterns, a distance between the non-print scattering pattern and the second print scattering pattern, or a combination thereof.

12. The method according to claim 11, wherein:
the preset width of the non-print scattering pattern ranges from about 10 nm to about 50 nm;
the distance between the non-print scattering pattern and the second pattern ranges from about 30 nm to about 100 nm; and
the distance between the non-print scattering pattern and the second print scattering pattern ranges from about 20 nm to about 80 nm.

13. The method according to claim 11, wherein the non-print scattering pattern has a rectangular shape.

14. The method according to claim 1, wherein a size of the third pattern is greater than or a same as a size of the first print scattering pattern.

15. The method according to claim 1, wherein the to-be-etched pattern defines a pattern to be formed in a polysilicon layer by etching.

16. The method according to claim 1, wherein:
the first pattern in the first mask pattern includes a strip-shaped gate pattern, and
when overlapping with the first mask pattern, the second pattern in the initial second mask pattern overlaps with an end portion of the strip-shaped gate pattern of the first pattern in the initial second mask pattern.

17. The method according to claim 1, wherein:
the second pattern and the third pattern in the initial second mask pattern are light-transmitting patterns on a photomask.

18. The method according to claim 1, wherein adding the second print scattering pattern to the initial second mask pattern after overlaying on the first mask pattern includes:
adding the second print scattering pattern to the initial second mask pattern that has a low pattern density.

* * * * *